(12) United States Patent
Barabi

(10) Patent No.: US 6,559,665 B1
(45) Date of Patent: May 6, 2003

(54) TEST SOCKET FOR AN IC DEVICE

(75) Inventor: Nasser Barabi, Lafayette, CA (US)

(73) Assignee: Cerprobe Corporation, Hayward, CA (US)

( * ) Notice: Subject to any disclaimer, the term of this patent is extended or adjusted under 35 U.S.C. 154(b) by 0 days.

(21) Appl. No.: 09/542,131

(22) Filed: Apr. 4, 2000

Related U.S. Application Data

(62) Division of application No. 08/538,956, filed on Oct. 4, 1995, now Pat. No. 6,046,597.

(51) Int. Cl.[7] .......................... G01R 31/02; H01R 13/62
(52) U.S. Cl. .......................... 324/755; 324/754; 439/66
(58) Field of Search ................................. 324/755, 754, 324/765; 439/66, 68, 71

(56) References Cited

U.S. PATENT DOCUMENTS

| | | | | |
|---|---|---|---|---|
| 2,853,656 A | * | 9/1958 | Dowds | 361/784 |
| 4,029,375 A | * | 6/1977 | Gabrielian | 439/66 |
| 4,528,500 A | * | 7/1985 | Lightbody et al. | 439/66 |
| 5,127,837 A | * | 7/1992 | Shah et al. | 439/71 |
| 5,215,472 A | * | 6/1993 | Delprete et al. | 439/71 |
| 5,395,249 A | * | 3/1995 | Reynolds et al. | 439/66 |

* cited by examiner

*Primary Examiner*—Ernest Karlsen
(74) *Attorney, Agent, or Firm*—Donald L. Beeson

(57) ABSTRACT

A test socket for an IC device has relatively thin contact interface wall in which an having an array of double-ended pogo pins. The double-ended pogo pins provide resilient spring-loaded contacts for the I/O contacts of an IC device held in the socket as well as for the circuit contacts of a PC board to which the socket is mounted.

13 Claims, 4 Drawing Sheets

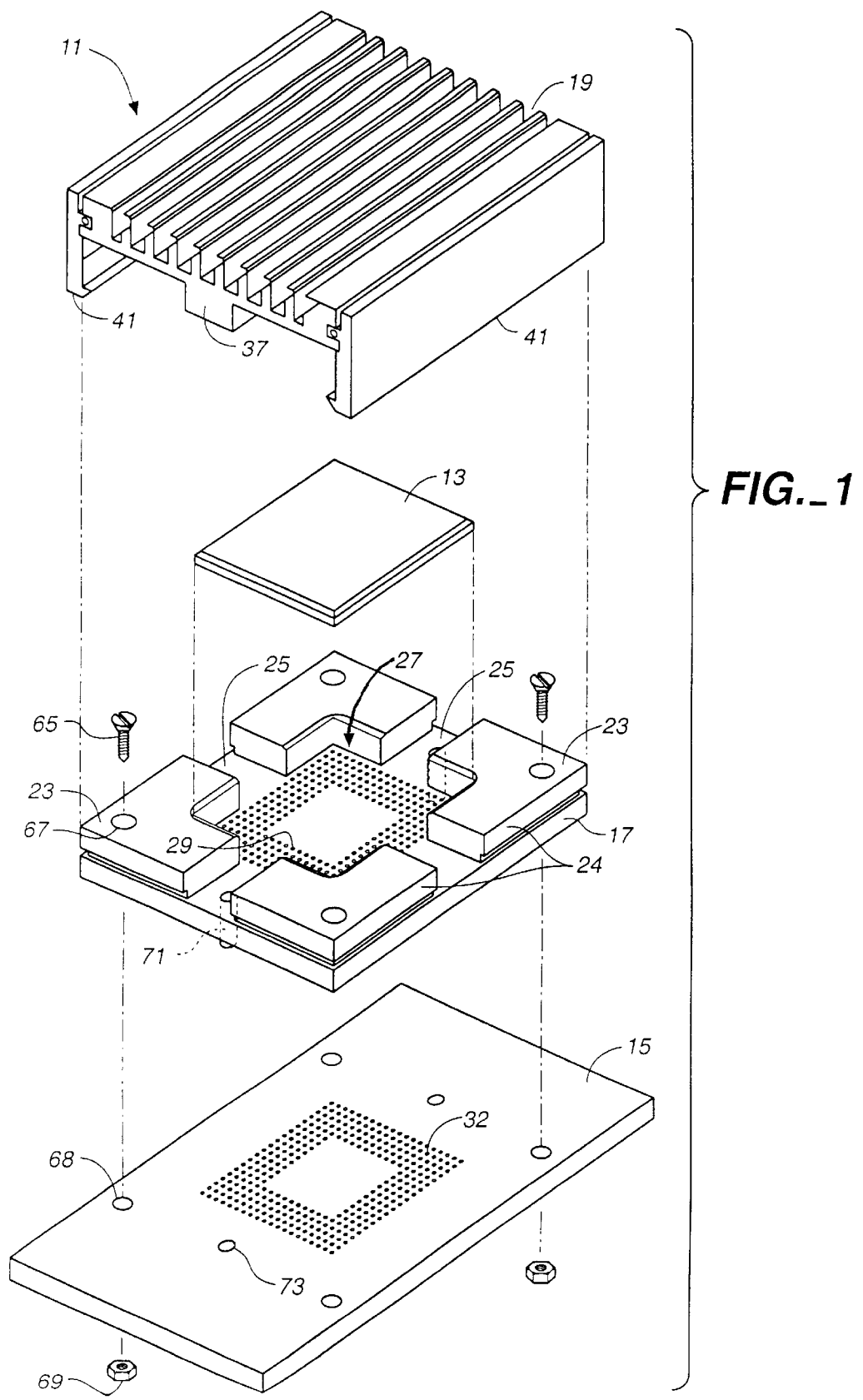
FIG._1

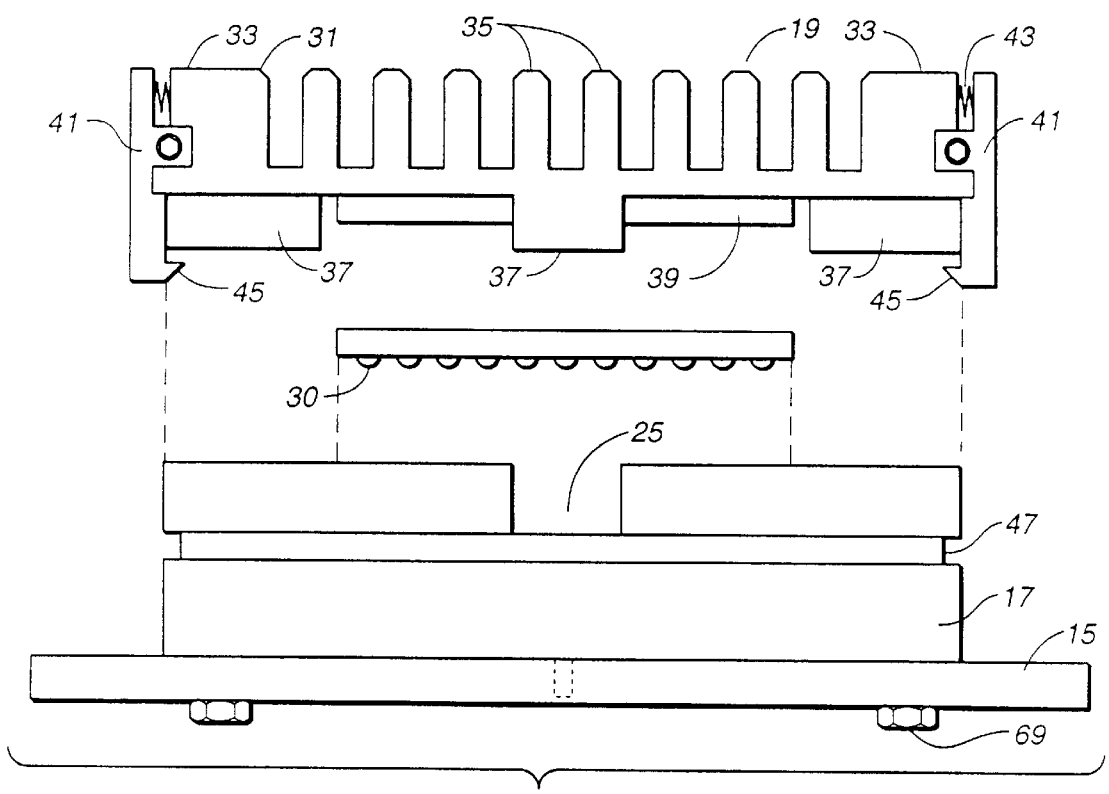
FIG._2
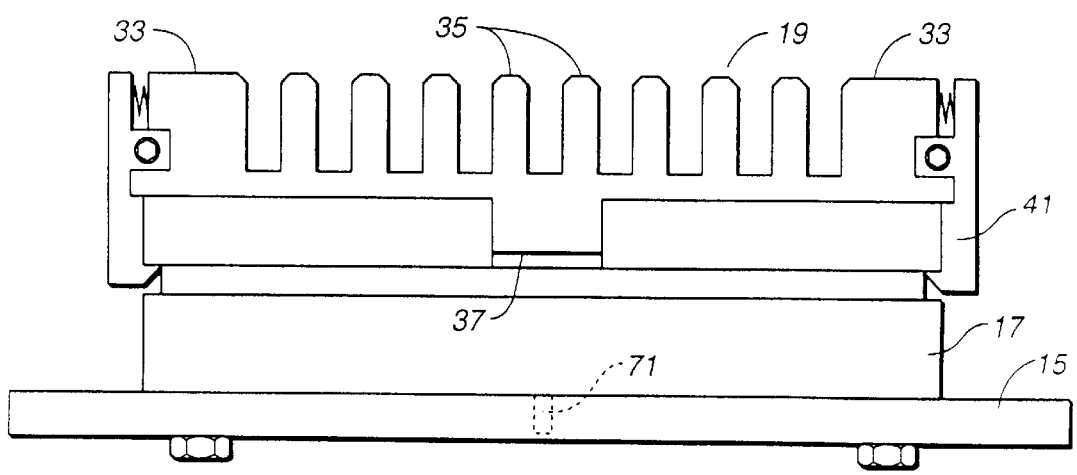
FIG._2A

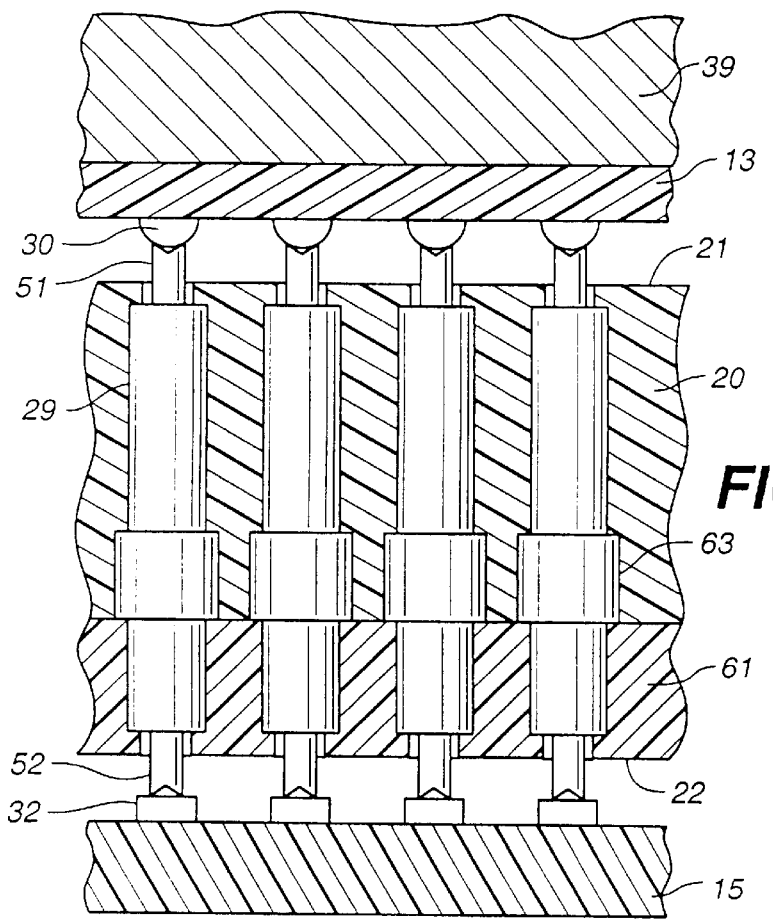
FIG._3
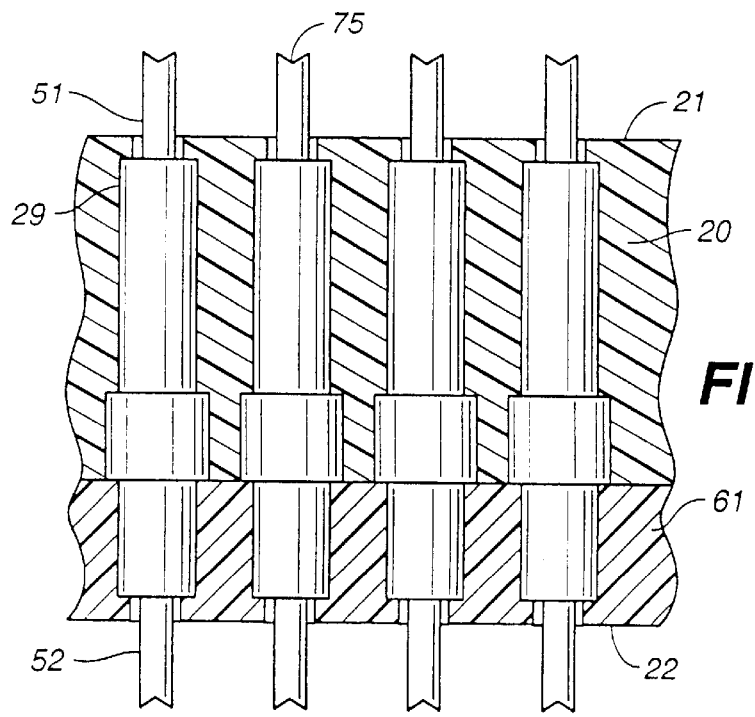
FIG._3A

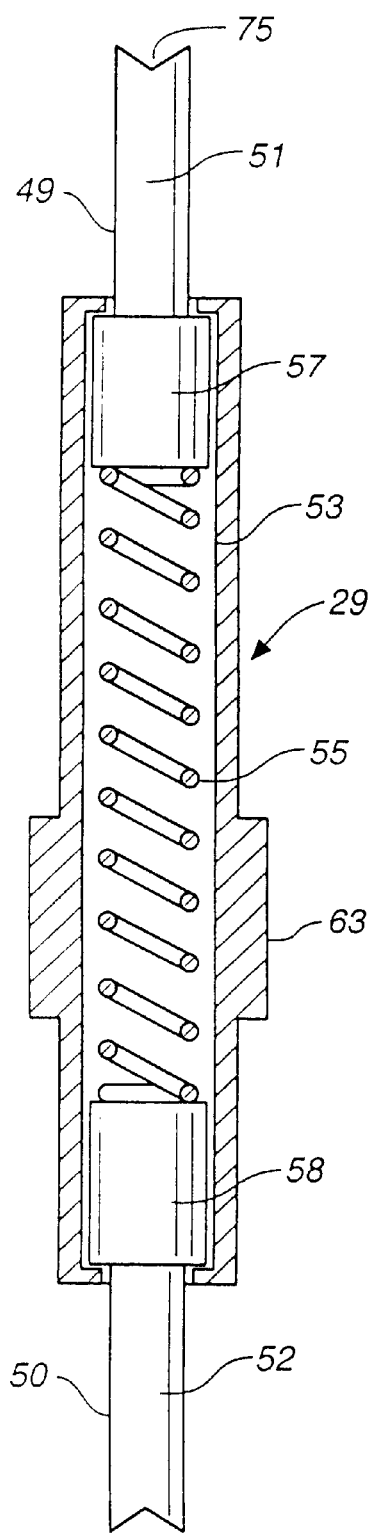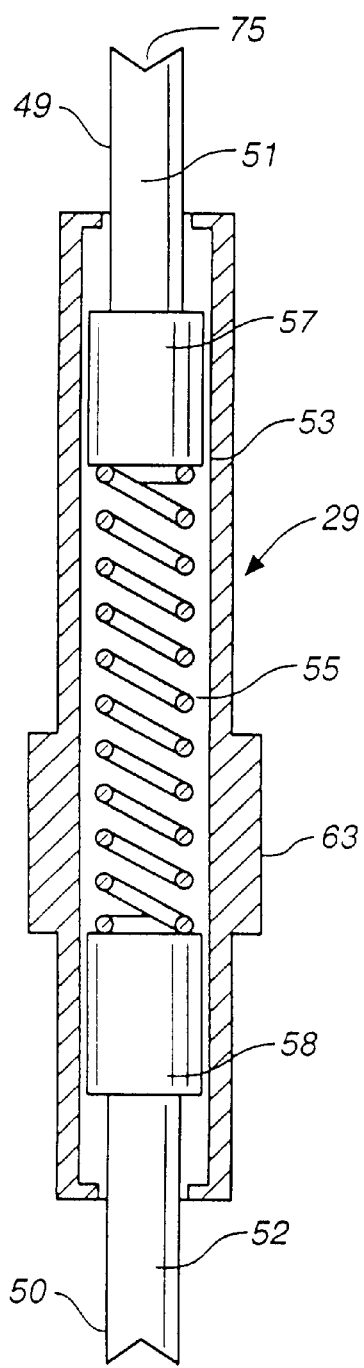
FIG._4      FIG._4A

TEST SOCKET FOR AN IC DEVICE

This application is a divisional of application Ser. No. 08/538,956 filed on Oct. 4, 1995, now U.S. Pat. No. 6,046,597.

BACKGROUND OF THE INVENTION

The present invention generally relates to the surface mounting of integrated circuit (IC) devices to a printed circuit (PC) board, and more particularly to test sockets for the test and burn-in of IC devices. The invention is particularly suited to the testing of leadless IC chips, but is not limited to such applications.

The increased capabilities of IC chips have led to increased input/output (I/O) densities and alternative techniques for mounting IC chips to printed circuit (PC) boards involving leadless IC chips. For example, ball grid array (BGA) mounting techniques have been developed to replace pin grid array (PGA) mounting approaches in order to achieve more densely packed contacts and smaller contact dimensions (in the order of 25 mils.). To facilitate the testing and burn-in of leadless IC devices, special test sockets have been devised to hold these devices and to temporarily connect them to a PC test board. Test sockets for leadless IC devices most commonly employ stamped or formed metal contact pins for achieving electrical interconnection between the I/O contacts of the IC device being tested and the PC test board circuits. Such socket designs have a relatively high profile and relatively high capacitance and inductance making them undesirable for high speed applications. They also require soldering of the socket pins to the PC board and do not operate efficiently with IC devices having noncompliant I/O contacts. Sockets having elastomeric contactors which do not require soldering have also been devised. These test sockets utilize flexible wire filaments which extend in a perpendicular relation to the contact points. Such wire filaments are generally not reliable and will not hold up with repetitive use. In addition, they are not likely to withstand the thermal shock while testing an IC device.

Still another known IC test socket design is a test socket having high profile, spring-loaded pins, called "pogo pins." Heretofore, the use of pogo pins in test sockets have been limited to relatively long, single-ended pogo pins wherein one end of each pogo pin is a fixed end soldered to the PC board and the other end is spring-loaded. Again, the relatively high profile of such test sockets make them unsuitable for high speed test applications. Also, since the fixed ends of the pogo pins are soldered to the PC board, such sockets are relatively difficult to remove.

The present invention overcomes the disadvantages of conventional test sockets for leadless IC devices by providing a low profile test socket suitable for high frequency test applications which will provide efficient and solderless contacts for both the PC board and the IC devices being tested.

SUMMARY OF THE INVENTION

Briefly, the present invention provides for an improved IC socket for surface mounting an IC device having a predetermined array of I/O contacts to a circuit board having a corresponding array of circuit contacts using an array of miniature, double-ended pogo pins which provide an array of resilient contacts for both the circuit contacts of the PC board and the I/O contacts of the IC device. More specifically, the IC socket has a body portion which includes a contact interface wall having opposed and substantially parallel mounting surfaces, one of the mounting surfaces of the interface wall is an interior mounting surface for receiving an IC device and the other of the mounting surfaces being an exterior surface for mounting the body portion of the socket to the circuit board. A plurality of substantially parallel conductor pins in the form of double-ended pogo pins extend through and are held by the contact interface wall in an array that corresponds to the predetermined array of the I/O contacts of the IC device (as well as to the corresponding circuit contacts of the circuit board). The conductor pins, which have contact ends that project beyond the mounting surfaces of the contact interface wall, provide a conductive path between these mounting surfaces. By using double-ended pogo pins, both contact ends of the pins will be resiliently depressible to provide spring-loaded contacts for both the IC device held in the socket and the circuit board to which the socket is mounted. Means for releasably holding an IC device against the interior mounting surface of the contact interface wall of the socket's body portion is provided such that the I/O contacts of the IC device remain in contact with the ends of the conductor pins at all times.

It is noted that the invention's substantially parallel conductor pin provide a conductor pin footprint that is the same on both sides of the socket. Thus, the socket receives an IC device having the same contact footprint as the contact footprint on the PC board to which it is mounted. This permits the IC device to be soldered directly to the PC board after the test socket, which is not soldered to the PC board, is removed.

Therefore, it can be seen that a primary object of the present invention is to provide an IC test socket suitable for high frequency applications and which provides efficient electrical contacts to both the I/O contacts of an IC device and the circuit contacts of a PC board. Another object of the invention is to provide a durable test socket that can withstand the thermal shock encountered in test and burn-in applications, and that can further withstand the repeated insertions and extractions of IC devices into and from the test socket. It is still another object of the invention to provide a test socket for an IC device having the same I/O contact footprint as the footprint of the circuit contacts (also called "pads") of the PC board to which it is mounted. Yet other objects of the invention will be apparent from the following specification and claims.

DESCRIPTION OF THE DRAWINGS

FIG. 1 is an exploded perspective view of an IC test socket in accordance with the invention as it would be mounted to a PC board.

FIG. 2 is an exploded side elevational view of the test socket shown in FIG. 1 with the base portion of the socket secured to the PC board.

FIG. 2A is a side elevational view of the test socket and PC board shown in FIG. 2 fully assembled.

FIG. 3 is an enlarged, fragmentary view in cross-section of the interface wall of the test socket body motion illustrated in FIG. 1 showing double-ended pogo pins held in the interface wall.

FIG. 3A is an enlarged, fragmentary view in cross-section of the contact interface wall of the test socket's body portion showing the contact ends of the double-ended pogo pins depressed by the contacts of an IC device and the contacts of a PC board to which the test socket is mounted.

FIG. 4 is an enlarged view of one of the double-ended pogo pins illustrated in FIG. 3.

FIG. 4A shows the pogo pin of FIG. 4 with the contact ends of the pogo pin depressed.

DETAILED DESCRIPTION OF THE ILLUSTRATED EMBODIMENT

Referring now to the drawings, FIGS. 1, 2 and 2A illustrates a test socket 11 for surface mounting IC chip 13 to PC board 15. The test socket includes body portion 17 and a latch cover 19 which serves as a means for releaseably holding IC chip 13 in the socket's body portion. Referring to FIG. 3, it can be seen that the body portion is formed to provide a relatively thin contact interface wall 20 having opposed and substantially parallel mounting surfaces. One of the mounting surfaces is the interior mounting surface 21 which receives IC chip 13, while the other mounting surface of the contact interface wall is an exterior mounting surface 22 against which the IC test socket is mounted to PC board 15. The body portion of the test socket further includes shoulder portions 23 which form an elevated perimeter 24 having a latch cover alignment slots 25. Perimeter 24 further defines an interior region 27 sized to capture and hold IC chip 13 such that its I/O contacts 30 (see FIG. 3) are precisely aligned with the array of parallel conductor pins 29 held in the body's contact interface wall.

Further referring to FIGS. 1, 2 and 2A, the sockets latch cover 19 has a cover plate 31 which can suitably be fabricated of aluminum and which can serve as a heat sink for the IC chip. The cover plate includes lateral edge portions 33 and upwardly extending heat fins 35 distributed along the top of the cover plate between the cover plate's two lateral edges. Alignment posts 37, which are shaped to mate with the alignment slots 25 of the socket's body portion 17, are provided to permit the gross alignment of the latch cover over the socket body portion. An additional pressure plate 39 is also provided on the bottom of the cover plate and is centrally located to permit it to bear against the top of IC chip 13 when the socket is assembled. In applications where the latch cover is to act as a heat sink, the pressure plate 39 is metal, and suitably integral to cover plate 31, to conduct heat away from the IC chip. In applications where the latch cover is not intended to act as a heat sink, pressure plate 39 can suitably be a plastic material such as Ultern™ 1000. Similarly, the alignment ports 37 can be fabricated of a metal or plastic material, depending on the application.

Latch cover 19 is releaseably held to the body portion of the socket by means of opposed latch handles 41 pivotally mounted to lateral edges 33 of cover plate 31. The latch handles are spring-loaded by means of compression springs 43 and has a cammed locking ridge 45 which snaps into locking groove 47 on the perimeter of the socket's body portion as shown in FIG. 2A when the latch cover is placed down over the body portion.

FIGS. 3, 3A, 4 and 4A illustrate in greater detail the contact interface wall 20 of the socket body portion and the conductor pins held thereby. Conductor pins 29 are held in the contact interface wall 20 in an array of straight and parallel pins that corresponds to the footprint of both the array of I/O contacts 30 on the bottom of IC chip 13 and the circuit contacts or "pads" 32 of PC board 15 to which the IC chip is to be surface mounted. Referring to FIG. 4, it can be seen that each of the straight conductor pins is in the form of a double ended pogo pin having oppositely extending contact ends 51, 52 which are depressible within pin casing 53 against internal compression spring 55 which exerts a restoring force against the enlarged base ends 57, 58 of each of the contact ends.

Body portion 17 of the socket is fabricated from an insulator material, suitably a plastic material, the composition of which will depend on the application. For high temperature applications, a material such as Vespel™ can be used, while for low temperature applications, a material such as Ultern™ can be employed. To permit insertion and retention of the conductor pins in the contact interface wall of the body portion, the body portion can suitably be provided with a separate bottom cover plate 61 which fits onto the bottom of the body portion 17 after the conductor pins have been inserted into predrilled holes in the interface wall. Enlarged collar portions 63 on the outside diameter of the conductor pin casing 53 will fit into a counterboard portion of the pin holes and will fix the pins in the wall when bottom cover plate 61 is installed. Bottom cover plate 61 can be secured to the body portion by mechanical means, such as screws, or a suitable adhesive, or both.

To use the test socket of the invention, the socket's body portion 17 is first secured to PC board 15 by means of any suitable attachment means such as attachment screws 65 which extend through aligned attachment screw openings 67, 68 in, respectively, the socket's body portion and the PC board. Attachment nuts thread onto the attachment screw 65 from the back side of the PC board. Locator pins 71 and corresponding locator holes 73 are provided to precisely locate the socket body 17 over the PC board circuit contacts 32.

The operation of the double-ended pogo pin type conductor pins is best illustrated in reference to FIG. 3. In FIG. 3, the bottom contact ends 51 of conductor pins 29 contact and are depressed slightly when the contact ends meet the circuit contacts 32 of PC board 15 when the socket's body portion is mounted to the PC board as above described. Similarly, as the IC chip 13 is pressed against the top of the interface wall 20 by means of pressure plate 39 of the socket's latch cover 19, the I/O contacts on the bottom of the IC chip are pressed against the upper contact ends 51 of conductor pins 29 to slightly depress these ends. Because both contact ends of the conductor pins are resiliently depressible, they will exert a spring-like force against the contacts of the IC chip and circuit board and will account for any lack of coplanarity in these contact points. Such contacts can be made with minimal insertion force, that is, only that force required to slightly depress the contact ends of the conductor pins. It is noted that the tips 75 of the contact ends of the conductor pins have a recessed V-shape shape to increase the area of the conductor pin that actually comes into contact with the ball-shaped contact points of the PC board. which are well suited to provide good electrical contact with the ball-shaped contacts of the IC device and the surface pad contacts of the PC board.

Conductor pins 29 while be miniature conductor pins capable of providing a low profile contact between PC board and the IC chip. The conductor pins can suitably have an overall length, including the contact ends, of approximately 0.220 inches, a casing outside diameter of approximately 0.025 inches, and a contact end diameter of approximately 0.0120 inches. Preferably the overall length of the conductor pins will be less than approximately 0.250 inches. The length of the conductor pin casing 53 can suitably have a dimension of approximately 0.160 inches with the overall thickness of the contact interface wall 20 being slightly larger than this dimension. Such dimensions will be consistent with a low profile contact suitable for high frequency test applications.

Therefore, it can be seen that the present invention provides a test socket for efficiently surface mounting a leadless IC chip to a circuit board involving solderless connections and small insertion forces. At the same time, the test socket of the invention has a relatively low profile and is suitable for use in high frequency test and burn-in applications. The test socket of the invention also provides a uniform contact footprint from one side of the socket to the other which permits the socket to be removed and the IC device soldered directly to the PC board. While the invention has been described in considerable detail in the foregoing specification, it is understood that it is not intended that the invention be limited to such detail, except as necessitated by the following claims.

What I claim is:

1. An IC socket for surface mounting an IC device having a predetermined array of I/O contacts to a circuit board having a corresponding array of circuit contacts, said IC socket comprising a body portion which includes an insulating and relatively thin contact interface wall having opposed and substantially parallel mounting surfaces, one of said mounting surfaces being an interior mounting surface for receiving an IC device and the other of said mounting surfaces being an exterior mounting surface for mounting the body portion to a circuit board, said body portion further including a perimeter defining an internal cavity region for holding the IC device in position the over the contact interface wall, a plurality of relatively short conductor pins extending through and held by said contact interface wall in a array corresponding to a predetermined array of I/O contacts of an IC device, each of said conductor pins including a conductive barrel-shaped pin casing having opposed ends and an inside diameter, oppositely directed depressible pin contacts each of which has an enlarged diameter base end slidably captured within one end of the pin casing and each of which has a projecting contact end of a smaller diameter than its base end, and an internal compression spring extending between and abutting the base ends of said pin contacts within said pin casing, said compression spring having a diameter substantially corresponding to the diameter of the base ends of said pin contacts, and the contact ends of the contact pins of said pin conductors projecting from the ends of the pin casing beyond the mounting surfaces of said contact interface wall to provide a conductive path therebetween, each of the pin contacts of said conductor pins being resiliently depressible against the conductor pin's internal compression spring to provide spring loaded contacts for both the I/O contacts of an IC device and the circuit contacts of a circuit board contacted thereby, and means for releaseably holding an IC device against the interior mounting surface of the contact interface wall of said body portion such that the I/O contacts of the IC device remain in contact with the pin contacts of the conductor pins projecting from said interior mounting surface.

2. The IC socket of claim 1 wherein the length of said conductor pins is less than approximately 0.25 inches.

3. The IC socket of claim 1 wherein said conductor pins are straight conductor pins held in parallel relation in said contact interface wall to provide an array of conductor pins that has the same footprint at each of said interior and exterior mounting surfaces.

4. The IC socket of claim 6 wherein the compression spring of each said conductor pin has a diameter that is comparable to the inside diameter of the barrel shaped casing thereof.

5. The IC socket of claim 4 wherein the internal compression spring of each said conductor pin contacts the base ends of the pin contacts thereof in non-captured relation to permit lateral free movement of the compression spring within the pin casing of the conductor pin.

6. The IC socket of claim 1 wherein said body portion has a bottom and includes a bottom cover plate removably attached to said bottom for removably holding said conductor pins in the contact interface wall of said body portion, said cover plate forming a portion of said interface wall, wherein the contact interface wall of said body portion includes an array of pre-drilled holes for insertably receiving said conductor pins, said pre-drilled holes each having a counterbore at the bottom of said body portion, and wherein the pin casing of each said conductor pin has an enlarged collar which fits within the counterbore of the pre-drilled holes in said contact interface wall for retaining the conductor pins in the interface wall when the bottom cover plate is removably attached to the bottom thereof.

7. A body for an IC socket for surface mounting an IC device having a predetermined array of I/O contacts to a circuit board having a corresponding array of circuit contacts, said IC socket body comprising an insulating and relatively thin contact interface wall having opposed and substantially parallel mounting surfaces, one of said mounting surfaces being an interior mounting surface for receiving an IC device and the other of said mounting surfaces being an exterior mounting surface for mounting the IC socket body to a circuit board, a perimeter defining an internal cavity region for holding an IC device in position the over the contact interface wall, and a plurality of relatively short conductor pins extending through and held by said contact interface wall in a array corresponding to a predetermined array of I/O contacts of an IC device, each of said conductor pins including a conductive barrel-shaped pin casing having opposed ends and an inside diameter, oppositely directed depressible pin contacts each of which has an enlarged diameter base end slidably captured within one end of the pin casing and each of which has a projecting contact end of a smaller diameter than its base end, and an internal compression spring extending between and abutting the base ends of said pin contacts within said pin casing, said compression spring having a diameter substantially corresponding to the diameter of the base ends of said pin contacts, and the contact ends of the contact pins of said pin conductors projecting from the ends of the pin casing beyond the mounting surfaces of said contact interface wall to provide a conductive path therebetween, each of the pin contacts of said conductor pins being resiliently depressible against the conductor pin's internal compression spring to provide spring loaded contacts for both the I/O contacts of an IC device and the circuit contacts of a circuit board contacted thereby.

8. The IC socket body of claim 7 wherein the length of said conductor pins is less than approximately 0.25 inches.

9. The IC socket body of claim 7 wherein said conductor pins are straight conductor pins held in parallel relation in said contact interface wall to provide an array of conductor pins that has the same footprint at each of said interior and exterior mounting surfaces.

10. The IC socket body of claim 7 wherein the compression spring of each said conductor pin has a diameter that is comparable to the inside diameter of the barrel shaped casing thereof.

11. The IC socket body of claim 10 wherein the internal compression spring of each said conductor pin contacts the base ends of the pin contacts thereof in non-captured relation to permit lateral free movement of the compression spring within the pin casing of the conductor pin.

12. The IC socket body of claim 7 wherein said body portion has a bottom and includes a bottom cover plate removably attached to said bottom for removably holding said conductor pins in the contact interface wall of said body portion, said cover plate forming a portion of said interface wall, wherein the contact interface wall of said body portion includes an array of pre-drilled holes for insertably receiving said conductor pins, said pre-drilled holes each having a counterbore at the bottom of said body portion, and wherein the pin casing of each said conductor pin has an enlarged collar which fits within the counterbore of the pre-drilled holes in said contact interface wall for retaining the conductor pins in the interface wall when the bottom cover plate is removably attached to the bottom thereof.

13. A body for an IC socket for surface mounting an IC device having a predetermined array of I/O contacts to a circuit board having a corresponding array of circuit contacts, said IC socket body comprising an insulating contact interface wall having opposed and substantially parallel mounting surfaces and a thickness of less than approximately 0.25 inches, one of said mounting surfaces being an interior mounting surface for receiving an IC device and the other of said mounting surfaces being an exterior mounting surface for mounting the IC socket body to a circuit board, a perimeter defining an internal cavity region for holding an IC device in position the over the contact interface wall, and a plurality of straight conductor pins extending through and held by said contact interface wall in a array corresponding to a predetermined array of I/O contacts of an IC device, each of said conductor pins including a conductive barrel-shaped pin casing having opposed ends and an inside diameter, oppositely directed depressible pin contacts each of which has an enlarged base end slidably captured within one end of the pin casing and each of which has a projecting contact end of a smaller diameter than its base end, and an internal compression spring extending in non-captured relation between the base ends of said pin contacts within said pin casing, the contact ends of the contact pins of said pin conductors projecting from the ends of the pin casing beyond the mounting surfaces of said contact interface wall to provide a conductive path therebetween, each of the pin contacts of said conductor pins being resiliently depressible against the conductor pin's internal compression spring to provide spring loaded contacts for both the I/O contacts of an IC device and the circuit contacts of a circuit board contacted thereby, the lenght of said conductor pins being less than approximately 0.25 inches.

* * * * *

UNITED STATES PATENT AND TRADEMARK OFFICE
CERTIFICATE OF CORRECTION

PATENT NO. : 6,559,665 B1
DATED : May 6, 2003
INVENTOR(S) : Barabi

It is certified that error appears in the above-identified patent and that said Letters Patent is hereby corrected as shown below:

Column 5,
Line 64, delete "Claim 6" and insert -- Claim 1 --.

Signed and Sealed this

Twenty-sixth Day of August, 2003

JAMES E. ROGAN
*Director of the United States Patent and Trademark Office*